US009842916B2

(12) United States Patent
Inoue et al.

(10) Patent No.: US 9,842,916 B2
(45) Date of Patent: *Dec. 12, 2017

(54) OXIDE SEMICONDUCTOR LAYER AND PRODUCTION METHOD THEREFOR, OXIDE SEMICONDUCTOR PRECURSOR, OXIDE SEMICONDUCTOR LAYER, SEMICONDUCTOR ELEMENT, AND ELECTRONIC DEVICE

(71) Applicants: Japan Advanced Institute of Science and Technology, Ishikawa (JP); Sumitomo Seika Chemicals Co., Ltd., Hyogo (JP)

(72) Inventors: Satoshi Inoue, Ishikawa (JP); Tatsuya Shimoda, Ishikawa (JP); Tomoki Kawakita, Hyogo (JP); Nobutaka Fujimoto, Osaka (JP); Kiyoshi Nishioka, Hyogo (JP)

(73) Assignees: JAPAN ADVANCED INSTITUTE OF SCIENCE AND TECHNOLOGY, Ishikawa (JP); SUMITOMO SEIKA CHEMICALS CO., LTD., Hyogo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/377,068

(22) Filed: Dec. 13, 2016

(65) Prior Publication Data
US 2017/0117393 A1    Apr. 27, 2017

Related U.S. Application Data

(63) Continuation of application No. 14/910,631, filed as application No. PCT/JP2014/067960 on Jul. 4, 2014, now Pat. No. 9,552,985.

(30) Foreign Application Priority Data

Aug. 9, 2013   (JP) .................................. 2013-166318
Dec. 19, 2013  (JP) .................................. 2013-262975

(51) Int. Cl.
*H01L 21/00* (2006.01)
*H01L 29/66* (2006.01)
(Continued)

(52) U.S. Cl.
CPC .. *H01L 29/66969* (2013.01); *H01L 21/02565* (2013.01); *H01L 21/02614* (2013.01);
(Continued)

(58) Field of Classification Search
None
See application file for complete search history.

(56) References Cited

U.S. PATENT DOCUMENTS 7,560,049 B2   7/2009  Newsome et al.
8,278,136 B2  10/2012  Tanaka et al.
(Continued)

FOREIGN PATENT DOCUMENTS

JP    2007-134547 A    5/2007
JP    2007-165900 A    6/2007
(Continued)

OTHER PUBLICATIONS

Supplementary European Search Report for European Patent Application No. 14835273.5 dated Feb. 10, 2017, 7 pp.
(Continued)

*Primary Examiner* — Benjamin Sandvik
(74) *Attorney, Agent, or Firm* — Buckley, Maschoff & Talwalkar LLC

(57) ABSTRACT

The invention provides an oxide semiconductor layer that has less cracks and is excellent in electrical property and stability, as well as a semiconductor element and an electronic device each including the oxide semiconductor layer. The invention provides an exemplary method of producing an oxide semiconductor layer, and the method includes the precursor layer forming step of forming, on or above a
(Continued)

substrate, a layered oxide semiconductor precursor including a compound of metal to be oxidized into an oxide semiconductor dispersed in a solution including a binder made of aliphatic polycarbonate, and the annealing step of heating the precursor layer at a first temperature achieving decomposition of 90 wt % or more of the binder, and then annealing the precursor layer at a temperature equal to or higher than a second temperature (denoted by X) that is higher than the first temperature, achieves bonding between the metal and oxygen, and has an exothermic peak value in differential thermal analysis (DTA).

16 Claims, 12 Drawing Sheets

(51) Int. Cl.
    *H01L 21/02*     (2006.01)
    *H01L 27/12*     (2006.01)
    *H01L 29/786*     (2006.01)

(52) U.S. Cl.
    CPC .... *H01L 21/02664* (2013.01); *H01L 27/1225* (2013.01); *H01L 29/7869* (2013.01); *H01L 21/02483* (2013.01)

(56) References Cited

U.S. PATENT DOCUMENTS

| | | | |
|---|---|---|---|
| 9,293,325 | B2 | 3/2016 | Shimoda et al. |
| 9,293,326 | B2 | 3/2016 | Steiger et al. |
| 9,543,143 | B2 | 1/2017 | Umeda et al. |
| 9,552,985 | B2 * | 1/2017 | Inoue .................. C01G 15/00 |
| 2008/0182011 | A1 | 7/2008 | Ng et al. |
| 2009/0294964 | A1 | 12/2009 | Higashi et al. |
| 2011/0244007 | A1 | 10/2011 | Matsui et al. |
| 2012/0288987 | A1 | 11/2012 | Radu et al. |
| 2013/0140503 | A1 | 6/2013 | Hiroi et al. |
| 2013/0196469 | A1 | 8/2013 | Facchetti et al. |
| 2014/0103341 | A1 | 4/2014 | Umeda et al. |
| 2015/0001536 | A1 | 1/2015 | Shimoda et al. |

FOREIGN PATENT DOCUMENTS

| | | |
|---|---|---|
| JP | 2007-201056 A | 8/2007 |
| JP | 2009-290112 A | 12/2009 |
| JP | 2013-18696 A | 1/2013 |
| TW | 201028437 B | 10/2014 |
| TW | 201304008 B | 6/2017 |
| WO | 2012/104885 A1 | 2/2012 |
| WO | 2012/103528 A2 | 8/2012 |

OTHER PUBLICATIONS

International Search Report for PCT/JP2014/067960 dated Oct. 7, 2014, 2 pp.

Translation of Taiwan Office Action for Taiwan Patent Application No. 103123895 dated Aug. 10, 2017, 7 pp.

Taiwan Office Action for Taiwan Patent Application No. 103123895 dated Aug. 10, 2017, 7 pp.

* cited by examiner

[Fig 1]
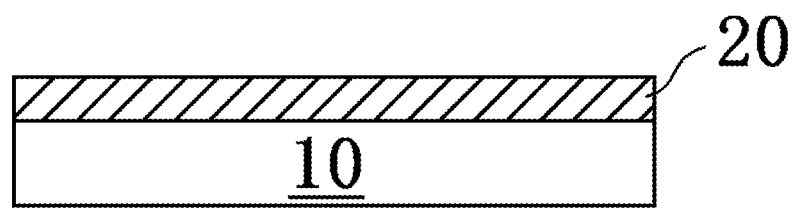
[Fig 2]
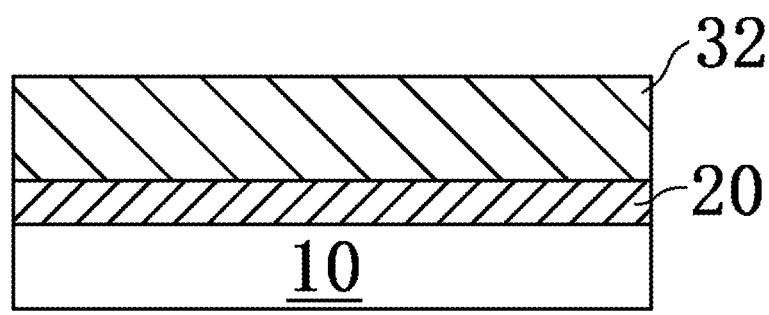

[Fig 3]
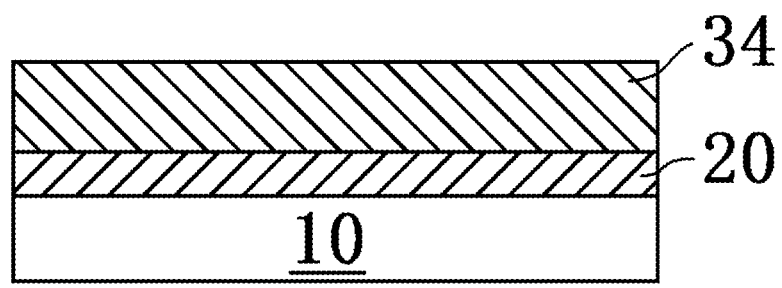
[Fig 4]
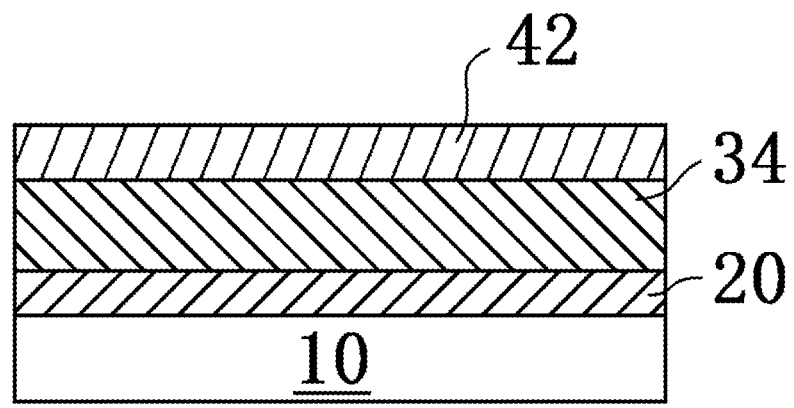

[Fig 5]
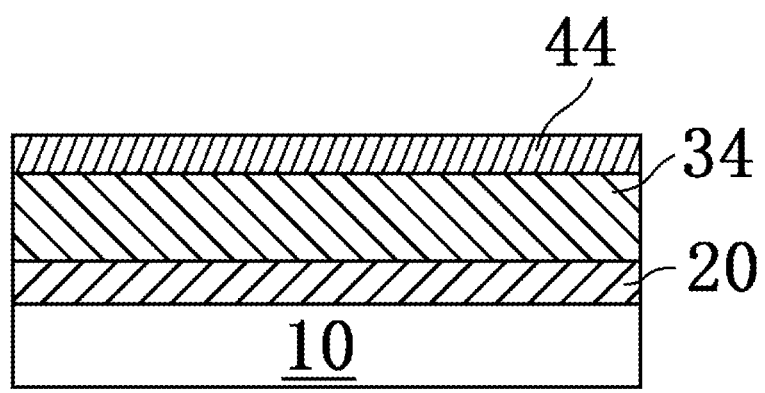
[Fig 6]
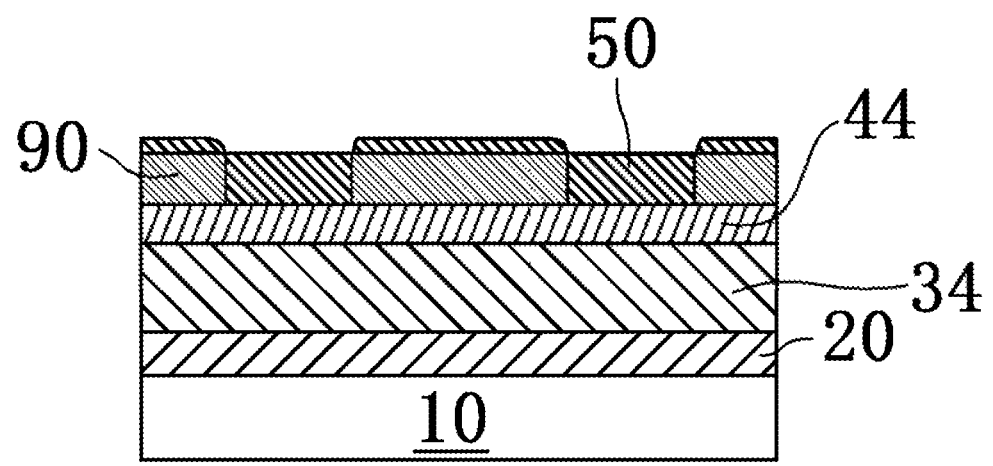

[Fig 7]
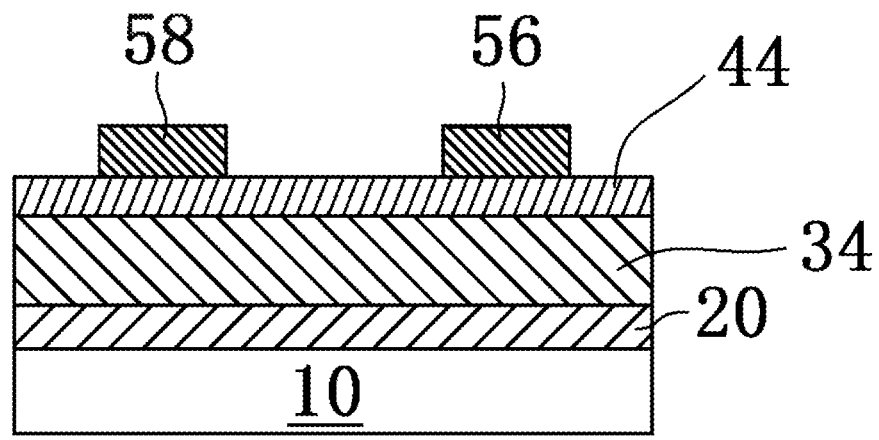
[Fig 8]
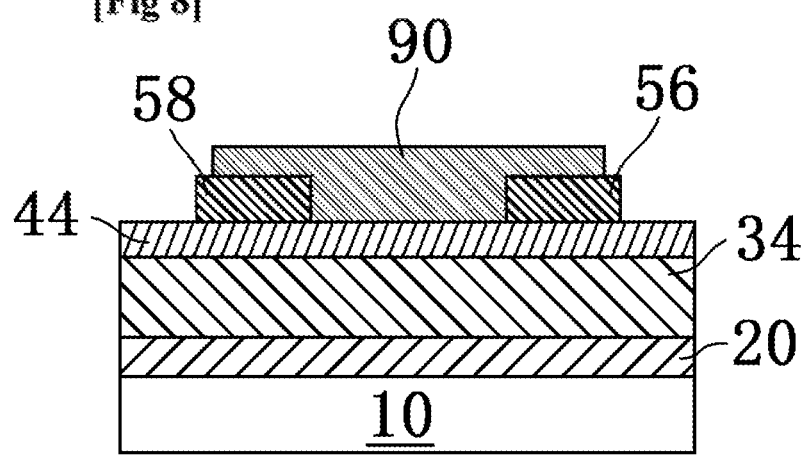

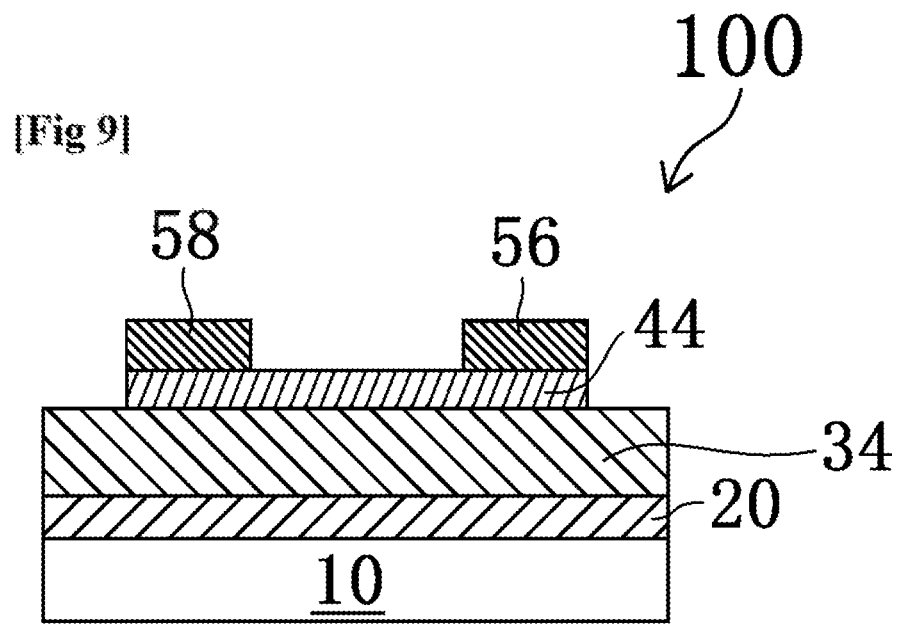
[Fig 9]
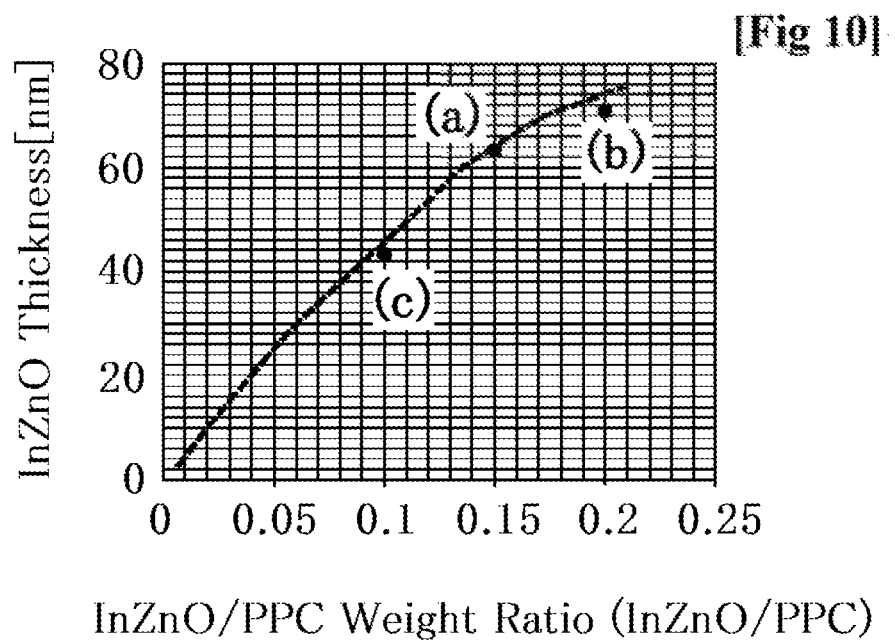
[Fig 10]

[Fig 11]
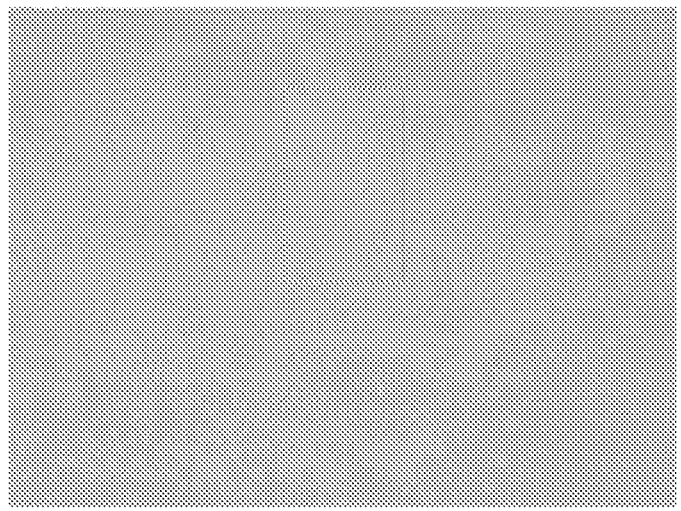
[Fig 12]
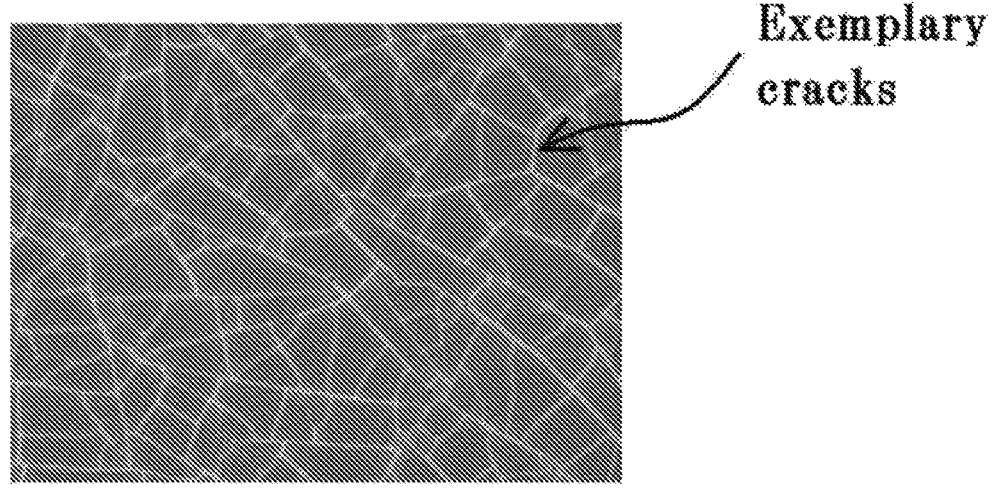
Exemplary cracks

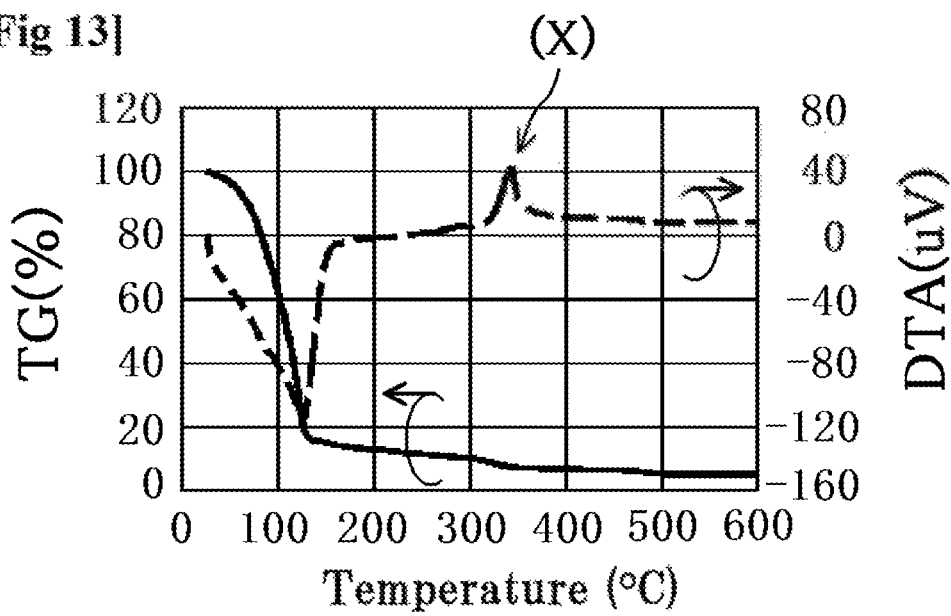
[Fig 13]
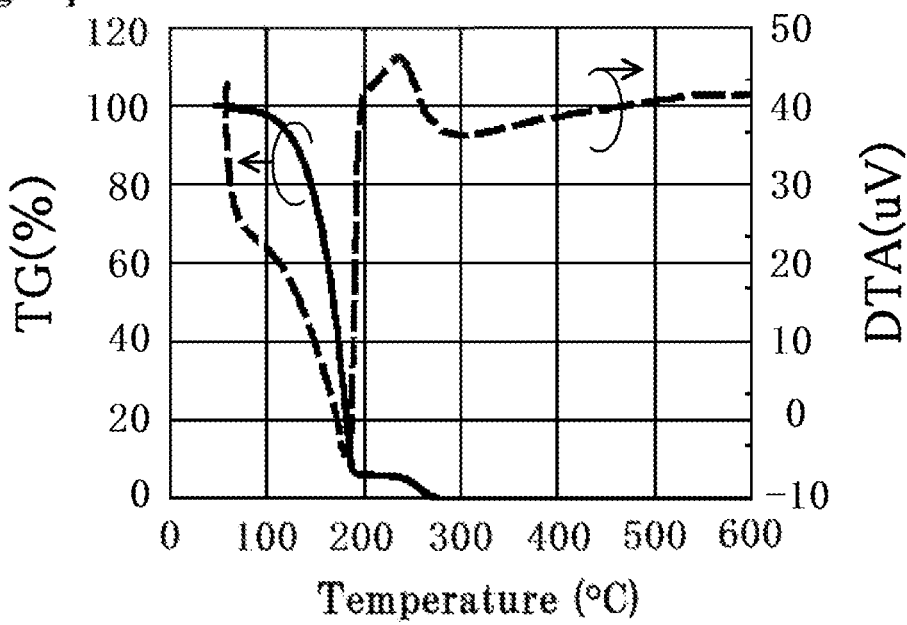
[Fig 14]

[Fig 15]
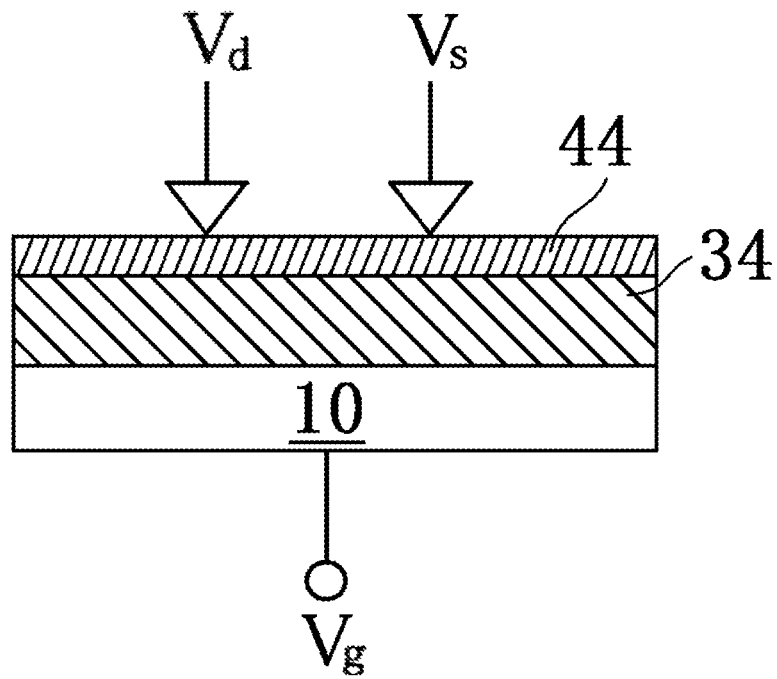
[Fig 16]
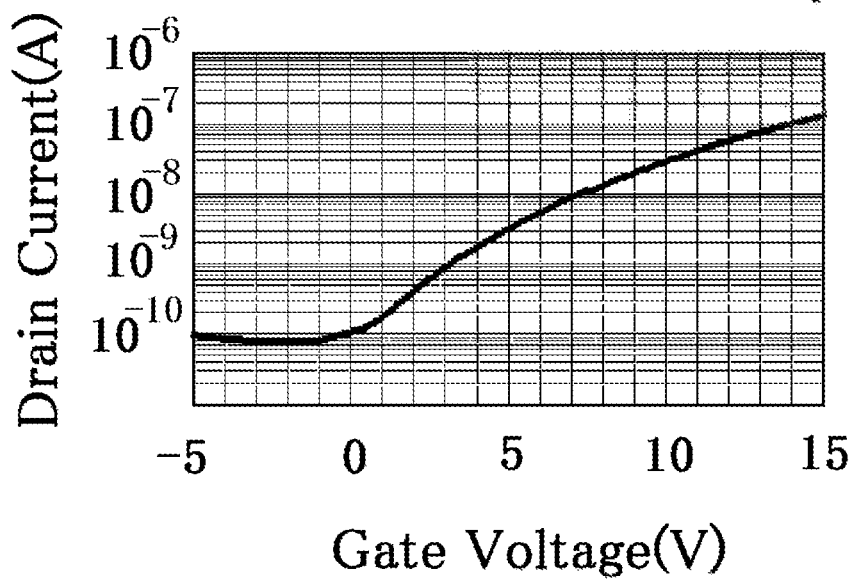
PPC : InZn solution= 10:2

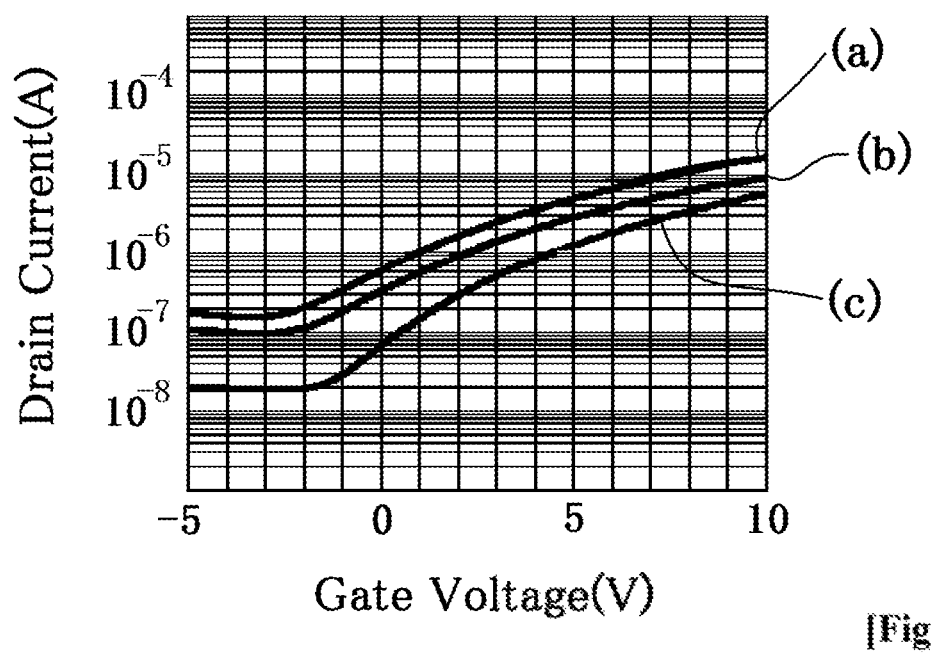
[Fig 17]
(a) PPC:InZnsolution= 10:1.5
(b) PPC:InZnsolution= 10:2
(c) PPC:InZnsolution= 10:1

[Fig 18]
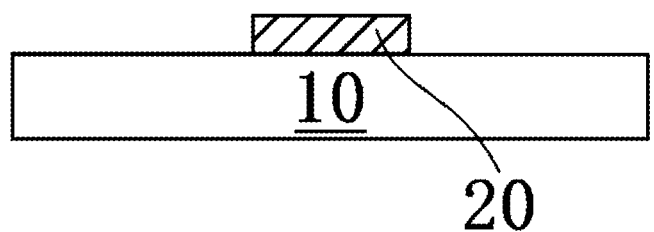
[Fig 19]
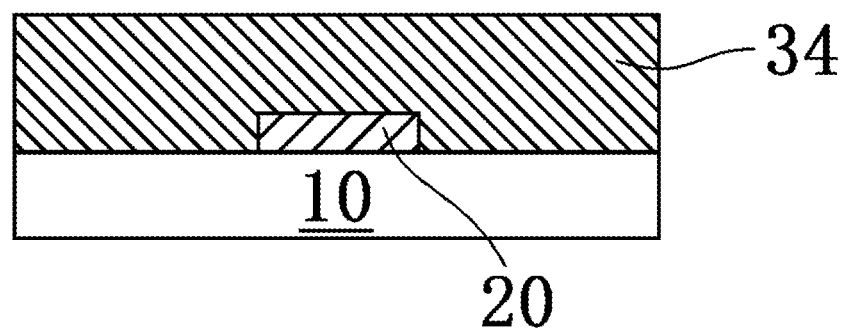

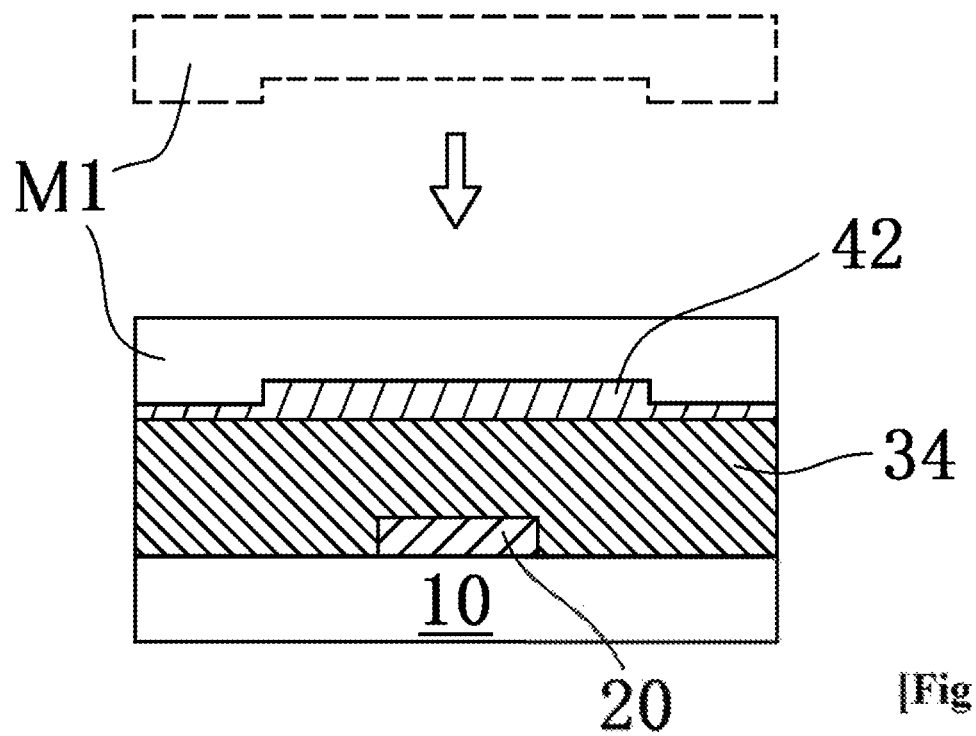
[Fig 20]
[Fig 21]
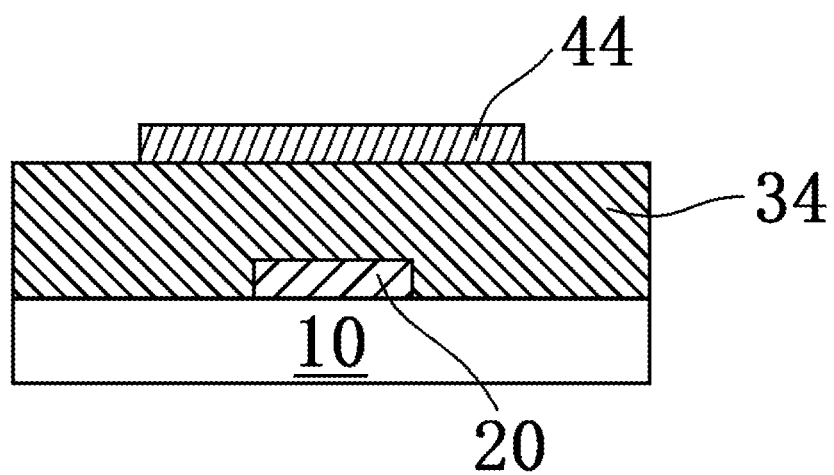

[Fig 22]
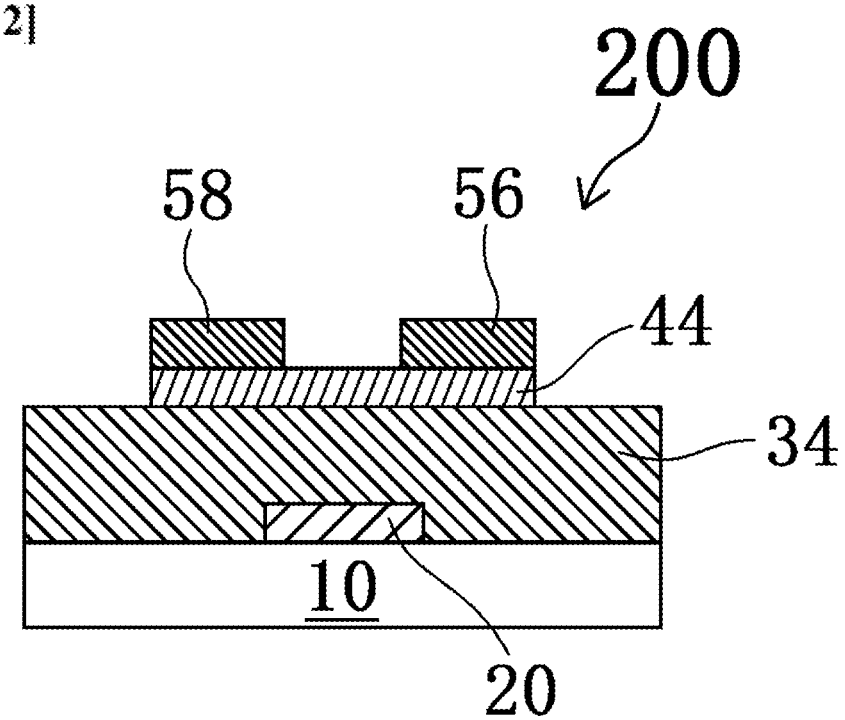

OXIDE SEMICONDUCTOR LAYER AND PRODUCTION METHOD THEREFOR, OXIDE SEMICONDUCTOR PRECURSOR, OXIDE SEMICONDUCTOR LAYER, SEMICONDUCTOR ELEMENT, AND ELECTRONIC DEVICE

This application is a continuation of U.S. application Ser. No. 14/910,631, filed Feb. 5, 2016, for "OXIDE SEMICONDUCTOR LAYER AND PRODUCTION METHOD THEREFOR, OXIDE SEMICONDUCTOR PRECURSOR, OXIDE SEMICONDUCTOR LAYER. SEMICONDUCTOR ELEMENT, AND ELECTRONIC DEVICE", claiming priority to U.S. National Stage filing under 35 U.S.C. §371 and 35 U.S.C §119, based on and claiming priority to PCT/JP2014/067960, filed Jul. 4, 2014, JP Patent Application No. 2013-262975, filed Dec. 19, 2013 and JP Patent Application No. 2013-166318, filed Aug. 9, 2013.

TECHNICAL FIELD

The present invention relates to an oxide semiconductor layer and a production method therefor, an oxide semiconductor precursor, an oxide semiconductor layer, a semiconductor element, and an electronic device.

BACKGROUND ART

A thin film transistor (TFT) is a small amplifier tube formed by stacking fine and thin films, and is a three-terminal element including a gate, a source, and a drain.

Conventionally, a polycrystalline silicon film or an amorphous silicon film has typically been adopted as a channel layer of a thin film transistor. However, when a polycrystalline silicon film is used, electron scatter at the interface between crystal grains and the like limit electron mobility thereby to cause variation in transistor property. When an amorphous silicon film is used, electron mobility is very low and an element tends to deteriorate with time thereby to cause lower element reliability. In this regard, an oxide semiconductor has been attracting interests, which is higher in electron mobility than an amorphous silicon film and has less variation in transistor property than a polycrystalline silicon film.

There has been an active attempt to produce an electronic device on a flexible resin substrate in accordance with a low-energy production process such as a printing method or an application method. There is an advantage that a semiconductor layer can be patterned directly on the substrate in accordance with a printing method or an application method and no etching step is thus required for patterning.

As disclosed in Patent Documents 1 to 3, there has been an attempt to produce a coated flexible electronic device including a conductive polymer or an organic semiconductor, for example.

PRIOR ART DOCUMENT

Patent Documents

Patent Document 1: JP 2007-134547 A
Patent Document 2: JP 2007-165900 A
Patent Document 3: JP 2007-201056 A

SUMMARY OF THE INVENTION

Problems to be Solved by the Invention

While the industry and consumers demand various information terminals and information appliances, a semiconductor is required to operate at higher speed, to be stable for a long period of time, and to apply a less environmental load. However, the conventional technique typically includes the vacuum process, a process according to the photolithography technique, or the like, which requires a relatively long time period and/or expensive equipment. Therefore, these processes lead to very low utilization efficiency of raw materials and production energy. This is not preferred from the industrial and mass productivity perspectives. It is very difficult under the present condition to apply the above process according to the printing method or the application method (hereinafter, collectively called a "low-energy production process") to a silicon semiconductor that has been mainly used to date. Even in a case where any one of the conductive polymer and the organic semiconductor disclosed in Patent Documents 1 to 3 is adopted, the conductive polymer and the organic semiconductor are still insufficient in electrical property and stability.

A semiconductor element and an electronic device produced through such a low-energy production process using a functional solution or a functional paste are now attracting large attention in the industry in terms of flexibilization of the electronic device as well as from the industrial and mass productivity perspectives mentioned above.

There is, however, a difference between the thickness of a layer formed in accordance with a printing method typically exemplifying a low-energy production process and the necessary thickness of a layer for a semiconductor element. Specifically, a relatively thick layer is formed for patterning according to a printing method whereas the necessary thickness of a layer for a semiconductor element is generally very thin. A paste or a solution used in a low-energy production process (e.g. an oxide semiconductor precursor including a compound of metal, which is to be oxidized into an oxide semiconductor, dispersed in a solution including a binder) has viscosity suitable for patterning. The viscosity of the past or the solution is thus adjusted by the added binder. Particularly for forming a layer configuring a semiconductor element (typically an oxide semiconductor layer), the layer has to be thinned after patterning with use of a paste or a solution including a binder and then removing the binder as much as possible. However, a problem of crack generation possibly arises in the thinning process.

Although some part of the binder is decomposed by annealing for formation of the oxide semiconductor layer, a certain amount of the binder still remains in the paste or the solution as impurities. Remaining impurities such as carbon impurities highly possibly cause deterioration in electrical property of a semiconductor if its amount exceeds a certain value. Accordingly, there are still many technical problems in production of a semiconductor element according to a low-energy production process.

Forming a thin oxide semiconductor layer as desired by annealing a film on a substrate formed in accordance with a low-energy production process and producing a semiconductor element including the oxide semiconductor layer in the current energy saving trend largely contribute to advancement in solving these problems.

Solutions to the Problems

The present invention solves at least one of the problems mentioned above to largely contribute to provision of an oxide semiconductor layer that has less cracks (or fissures; hereinafter, collectively called "cracks") and is excellent in electrical property and stability, as well as a semiconductor element and an electronic device each including the oxide semiconductor layer.

The inventors of this application performed multifaceted and detailed analysis on the process of forming a gel film from a liquid and the process of solidifying or sintering the gel film in the research on formation of various oxide semiconductor layers from liquid materials. As a result, the inventors have found that the above problems can be solved by selecting an oxide semiconductor precursor material that can be solidified or sintered from a gel film at a temperature high enough to be distinguishable from a temperature achieving substantially complete decomposition of a binder. The "process of forming a gel film from a liquid" is typically exemplified by a state where a binder and a solvent are removed by heat treatment but a compound of metal (e.g. a metal complex having a ligand), which is to be oxidized into an oxide semiconductor, is not decomposed. The "process of solidifying or sintering the gel film" is typically exemplified by a state where the ligand is decomposed and oxygen and the metal, which is to be oxidized into an oxide semiconductor, are substantially bonded.

The inventors of this application found, through many trials and errors as well as analysis, that electrical conductivity high enough for a semiconductor element can be achieved by forming a film from a material including a specific oxide semiconductor precursor dispersed in a solution in a binder made of an aliphatic polycarbonate. The inventors also found that the film can be formed easily in accordance with a low-energy production process. The present invention has been devised in accordance with these points and various analyses.

The present invention provides an exemplary method of producing an oxide semiconductor layer, the method including: the precursor layer forming step of forming, on or above a substrate, a layered oxide semiconductor precursor including a compound of metal to be oxidized into an oxide semiconductor dispersed in a solution including a binder made of an aliphatic polycarbonate (possibly including inevitable impurities); and the annealing step of heating the precursor layer at a first temperature achieving decomposition of 90 wt % or more of the binder, and then annealing the precursor layer at a temperature equal to or higher than a second temperature that is higher than the first temperature, achieves bonding between the metal and oxygen, and has an exothermic peak value in differential thermal analysis (DTA) for the precursor.

According to this method of producing the oxide semiconductor layer, the binder made of an aliphatic polycarbonate is mostly decomposed when heated at the first temperature achieving decomposition of 90 wt % or more of the binder. When the precursor layer is annealed at a temperature equal to or higher than the second temperature that is higher than the first temperature, achieves bonding between oxygen and metal to be oxidized into an oxide semiconductor, and has an exothermic peak value in the differential thermal analysis (DTA) for the oxide semiconductor precursor, impurities such as carbon impurities remaining in the oxide semiconductor layer can be reduced highly reliably. Because the binder is mostly decomposed when heated at the first temperature, occurring reaction will include substantially no decomposition of the binder and will relate mostly to bonding between the metal and oxygen during subsequent annealing at the second temperature. The method of producing the oxide semiconductor layer can thus achieve a semiconductor element and an electronic device that have less cracks and are excellent in electrical property and stability. In order to more reliably reduce remaining impurities such as carbon impurities, the first temperature preferably achieves decomposition of 95 wt % or more of the binder, and more preferably achieves decomposition of 99 wt % or more of the binder. The method of producing the oxide semiconductor layer easily achieves formation of a layer according to a low-energy production process.

An exemplary oxide semiconductor precursor according to the present invention includes a compound of metal to be oxidized into an oxide semiconductor dispersed in a solution including a binder made of an aliphatic polycarbonate (possibly including inevitable impurities). Furthermore, 90 wt % or more of the binder is decomposed at the first temperature lower than the second temperature that achieves bonding between the metal and oxygen and has the exothermic peak value in the differential thermal analysis (DTA) for the precursor.

In the oxide semiconductor precursor, the binder is mostly decomposed by being heated at the temperature (first temperature) that is lower than the temperature (second temperature) achieving bonding between oxygen and the metal to be oxidized into an oxide semiconductor and having the exothermic peak value in the differential thermal analysis (DTA) for the precursor, and achieves decomposition of 90 wt % or more of the binder. It is thus possible to highly reliably reduce impurities such as carbon impurities remaining in the oxide semiconductor layer obtained by annealing the precursor. Because the binder is mostly decomposed when heated at the first temperature, occurring reaction will include substantially no decomposition of the binder and will relate mostly to bonding between the metal and oxygen during subsequent annealing at the second temperature. Formation of an oxide semiconductor layer from the oxide semiconductor precursor can thus achieve a semiconductor element and an electronic device that have less cracks and are excellent in electrical property and stability. In order to more reliably reduce remaining impurities such as carbon impurities, the first temperature achieving decomposition of the binder preferably achieves decomposition of 95 wt % or more of the binder, and more preferably achieves decomposition of 99 wt % or more of the binder.

The present invention provides an exemplary oxide semiconductor layer formed by annealing a layer of an oxide semiconductor precursor including a compound of metal to be oxidized into an oxide semiconductor dispersed in a solution including a binder made of an aliphatic polycarbonate (possibly including inevitable impurities) at a temperature equal to or higher than a second temperature that achieves bonding between the metal and oxygen and has an exothermic peak value in differential thermal analysis (DTA) for the precursor, wherein 90 wt % or more of the binder is decomposed at a first temperature lower than the second temperature.

In the oxide semiconductor layer, the binder is mostly decomposed by being heated at the temperature (first temperature) that is lower than the temperature (second temperature) achieving bonding between oxygen and the metal to be oxidized into an oxide semiconductor and having the exothermic peak value in the differential thermal analysis (DTA) for the precursor, and achieves decomposition of 90 wt % or more of the binder. It is thus possible to highly reliably reduce impurities such as carbon impurities remaining in the oxide semiconductor layer. Because the binder is mostly decomposed when heated at the first temperature, reaction occurring at subsequent annealing at a temperature equal to or higher than the second temperature includes substantially no decomposition of the binder and relates mostly to bonding between the metal and oxygen. Adoption of the oxide semiconductor layer can thus achieve a semiconductor element and an electronic device that have less cracks and are excellent in electrical property and stability. In order to more reliably reduce remaining impurities such as carbon impurities, the first temperature achieving composition of the binder preferably achieves decomposition of 95 wt % or more of the binder, and more preferably achieves decomposition of 99 wt % or more of the binder.

A "substrate" in this application is not limited to a base in a plate shape but includes a base and a base material in different modes. A "layer" in this application conceptually includes a layer as well as a film. Similarly, a "film" in this application conceptually includes a film as well as a layer. The "application" in the embodiments to be descried later in this application indicates forming a layer on a substrate in accordance with a low-energy production process such as a printing method or an application method.

Effects of the Invention

An exemplary method of producing an oxide semiconductor layer according to the present invention can achieve highly reliable reduction of impurities such as carbon impurities remaining in the oxide semiconductor layer thus produced. It is thus possible to obtain a semiconductor element and an electronic device that have less cracks and are excellent in electrical property and stability. Furthermore, the method of producing the oxide semiconductor layer enables a low-energy production process. An exemplary oxide semiconductor precursor according to the present invention can achieve formation of an oxide semiconductor layer that includes highly reliably reduced impurities such as carbon impurities. An exemplary oxide semiconductor layer according to the present invention can include highly reliably reduced impurities such as carbon impurities. An exemplary oxide semiconductor precursor or an exemplary oxide semiconductor layer according to the present invention can thus achieve a semiconductor element and an electronic device that have less cracks and are excellent in electrical property and stability.

BRIEF DESCRIPTION OF THE DRAWINGS

FIG. 1 is a schematic sectional view of a process in a method of producing a thin film transistor according to a first embodiment of the present invention.

FIG. 2 is a schematic sectional view of a process in the method of producing the thin film transistor according to the first embodiment of the present invention.

FIG. 3 is a schematic sectional view of a process in the method of producing the thin film transistor according to the first embodiment of the present invention.

FIG. 4 is a schematic sectional view of a process in the method of producing the thin film transistor according to the first embodiment of the present invention.

FIG. 5 is a schematic sectional view of a process in the method of producing the thin film transistor according to the first embodiment of the present invention.

FIG. 6 is a schematic sectional view of a process in the method of producing the thin film transistor according to the first embodiment of the present invention.

FIG. 7 is a schematic sectional view of a process in the method of producing the thin film transistor according to the first embodiment of the present invention.

FIG. 8 is a schematic sectional view of a process in the method of producing the thin film transistor according to the first embodiment of the present invention.

FIG. 9 is a schematic sectional view of an entire structure of the thin film transistor according to the first embodiment of the present invention and a process in the production method therefor.

FIG. 10 is a graph indicating variation in thickness of an oxide semiconductor layer according to an example of the present invention.

FIG. 11 is an optical photomicrograph of a surface of the oxide semiconductor layer according to the example of the present invention.

FIG. 12 is an optical photomicrograph of a surface of an oxide semiconductor layer according to a comparative example of the present invention.

FIG. 13 is a graph indicating TG-DTA properties of an indium-zinc containing solution as an oxide semiconductor precursor configuring a channel of a thin film transistor according to the example of the present invention.

FIG. 14 is a graph indicating TG-DTA properties of a binder solution configuring a channel portion of the thin film transistor according to the example of the present invention.

FIG. 15 is a view of a Vg-Id properties measurement system of a channel of a thin film transistor according to an example corresponding to the first embodiment of the present invention.

FIG. 16 is a graph indicating Vg-Id properties of the channel of the thin film transistor according to the example corresponding to the first embodiment of the present invention.

FIG. 17 is a graph indicating Vg-Id properties of a channel of a thin film transistor according to an example corresponding to a modification example of the first embodiment of the present invention.

FIG. 18 is a schematic sectional view of a process in a method of producing a thin film transistor according to a second embodiment of the present invention.

FIG. 19 is a schematic sectional view of a process in the method of producing the thin film transistor according to the second embodiment of the present invention.

FIG. 20 is a schematic sectional view of a process in the method of producing the thin film transistor according to the second embodiment of the present invention.

FIG. 21 is a schematic sectional view of a process in the method of producing the thin film transistor according to the second embodiment of the present invention.

FIG. 22 is a schematic sectional view of an entire structure of the thin film transistor according to the second embodiment of the present invention and a process in the production method therefor.

DESCRIPTION OF REFERENCE SIGNS

10 Substrate
20 Gate electrode
32 Gate insulator (gate insulating layer) precursor layer
34 Gate insulator
42 Channel precursor layer
44 Channel
50 ITO layer
56 Drain electrode
58 Source electrode
90 Resist film 100,200 Thin film transistor
M1 Channel mold

EMBODIMENTS OF THE INVENTION

An oxide semiconductor precursor layer, an oxide semiconductor layer, a semiconductor element, and an electronic device, as well as production methods therefor according to each embodiment of the present invention will now be described in detail with reference to the accompanying drawings. In this disclosure, common parts are denoted by common reference signs in all the drawings unless otherwise specified. Furthermore, components according to these embodiments are not necessarily illustrated in accordance with relative scaling in the drawings. Moreover, some of the reference signs may not be indicated for the purpose of easier recognition of the respective drawings.

First Embodiment

1. Entire Structure of Thin Film Transistor According to the Present Embodiment

FIGS. 1 to 8 are schematic sectional views of processes in a method of producing a thin film transistor 100 as an exemplary semiconductor element. FIG. 9 is a schematic sectional view of a process in the method of producing the thin film transistor 100 according to the present embodiment and an entire structure of the thin film transistor. As depicted in FIG. 9, the thin film transistor 100 according to the present embodiment includes a substrate 10, as well as a gate electrode 20, a gate insulator (gate insulating layer) 34, a channel 44, a source electrode 58, and a drain electrode 56, which are stacked on the substrate 10 from the lower side in the mentioned order. A person skilled in the art comprehending the semiconductor element according to the present embodiment can fully comprehend provision or achievement of an electronic device including this semiconductor element (e.g. a mobile terminal, an information appliance, or any other publicly known electric appliance), with no particular description.

The thin film transistor 100 has the so-called bottom gate structure, although the present embodiment is not limited to this structure. A person skilled in the art having ordinary technical knowledge can thus form the top gate structure by changing the order of the steps with reference to the description of the present embodiment. Unless otherwise specified, temperatures indicated in this application are preset temperatures of a heater in contact with a substrate and are temperatures in a region adjacent to the surface of a heating target for a heater not in contact with a substrate. Patterning of an extraction electrode from each electrode is not depicted in order for simplification of the drawings.

The substrate 10 according to the present embodiment is not particularly limited and is generally included in a semiconductor element. The substrate 10 can be exemplified by any one of various insulating base materials including semiconductor substrates (e.g. a Si substrate, a SiC substrate, and a Ge substrate) such as highly heat resistant glass, a $SiO_2$/Si substrate (i.e. a silicon substrate provided thereon with an oxide silicon film), an alumina ($Al_2O_3$) substrate, an STO (SrTiO) substrate, and an insulating substrate obtained by forming an STO (SrTiO) layer on a surface of a Si substrate with a $SiO_2$ layer and a Ti layer being interposed therebetween. Examples of the insulating substrate include films and sheets made of materials such as polyesters including polyethylene terephthalate and polyethylene naphthalate, polyolefins, cellulose triacetate, polycarbonate, polyamide, polyimide, polyamide imide, polysulfone, aramid, and aromatic polyamide. The substrate is not particularly limited in thickness, and can be 3 μm or more and 300 μm or less. The substrate may be hard or flexible.

(1) Formation of Gate Electrode

The gate electrode 20 can be made of high melting metal such as platinum, gold, silver, copper, aluminum, molybdenum, palladium, ruthenium, iridium, or tungsten, a metal material such as alloy thereof, conductive metal oxide including ruthenium oxide, a $p^+$-silicon layer, or an $n^+$-silicon layer. As depicted in FIG. 1, the gate electrode 20 according to the present embodiment is formed on a $SiO_2$/Si substrate (hereinafter, also simply referred to as the "substrate") 10 serving as a base material in accordance with a known sputtering technique or a known CVD technique.

(2) Formation of Gate Insulator

In the thin film transistor 100 according to the present embodiment, the gate insulator 34 is made of silicon oxide (possibly including inevitable impurities; this applies hereinafter to oxide of this material as well as oxide of any other material) obtained from, as a starting material, a gate insulator precursor solution including a precursor containing silicon (Si) (e.g. polysilazane) as a solute.

As depicted in FIG. 2, a gate insulator precursor layer 32 according to the present embodiment is formed by applying the gate insulator precursor solution on a gate electrode layer 20 in accordance with a low-energy production process (e.g. a printing method or a spin coating method). The gate insulator precursor layer 32 is then subjected to the annealing step of heating at 400° C. for a predetermined period (e.g. two hours) in the atmosphere, for example. As depicted in FIG. 3, the gate electrode 20 is thus provided thereon with the gate insulator 34 as a silicon oxide layer. The gate insulator 34 according to the present embodiment can be about 100 nm thick.

(3) Formation of Channel

The channel 44 according to the present invention is formed by annealing a layer of an oxide semiconductor precursor (hereinafter, also referred to as an "oxide semiconductor precursor layer" or a "precursor layer"), which includes a compound of metal (also referred to as a "metal compound") to be oxidized into an oxide semiconductor dispersed in a solution including a binder made of an aliphatic polycarbonate (possibly including inevitable impurities; this applies hereinafter).

The metal compound can be exemplified by a material having a structure (typically a complex structure) in which a ligand is coordinated with metal to be oxidized into an oxide semiconductor (possibly including inevitable impurities). Examples of the metal compound according to the present embodiment can include a metal organic acid salt, a metal inorganic acid salt, a metal halide, and any metal alkoxide. Examples of a typical metal compound include a solution of propionic acid with indium acetylacetonate and zinc chloride dissolved therein. Indium-zinc oxide (hereinafter, also referred to as "InZnO") serving as an oxide semiconductor can be formed by annealing this solution.

Examples of the metal to be oxidized into an oxide semiconductor (possibly including inevitable impurities) include one, two, or more types selected from the group consisting of indium, tin, zinc, cadmium, titanium, silver, copper, tungsten, nickel, indium-zinc, indium-tin, indium-gallium-zinc, antimony-tin, and gallium-zinc. In terms of element performance, stability, and the like found by the inventors of this application, indium or indium-zinc is preferably adopted as the metal to be oxidized into an oxide semiconductor.

Due to the selection of the material according to the present embodiment, the temperature (second temperature) achieving bonding between the metal and oxygen and having an exothermic peak value in the differential thermal analysis (DTA) is sufficiently higher than the temperature achieving decomposition of the binder, or the temperature achieving decomposition of the binder is sufficiently lower than the temperature (second temperature) having the exothermic peak value. Accordingly, 90 wt % or more (more preferably 95 wt % or more, further preferably 99 wt % or more, and most preferably 99.9 wt % or more) of the binder can be decomposed more reliably.

The oxide semiconductor is not particularly limited in terms of its phase state. For example, the oxide semiconductor may be in any one of the crystal form, the polycrystal form, and the amorphous form. The present embodiment can also cover a phase state where grown crystal has a branch form or a scale form. Furthermore, the present embodiment is obviously not particularly limited by a patterned shape (e.g. a spherical shape, an elliptical shape, or a rectangular shape).

The binder and the solution including the binder according to the present embodiment will be described next.

The binder according to the present embodiment is an aliphatic polycarbonate of an endothermic decomposition type with excellent thermal decomposition properties. It is possible to find that thermal decomposition reaction of the binder is endothermic reaction in the differential thermal analysis (DTA). Such an aliphatic polycarbonate has a high oxygen content and can be decomposed into a low molecular weight compound at a relatively low temperature. The aliphatic polycarbonate thus positively contributes to reduction of impurities such as carbon impurities remaining in the oxide semiconductor layer.

An organic solvent adopted as a solution including a binder is not particularly limited in this application if the organic solvent allows dissolution of an aliphatic polycarbonate. Specific examples of the organic solvent include diethylene glycol monoethyl ether acetate, α-terpineol, β-terpineol, N-methyl-2-pyrrolidone, isopropyl alcohol, diethylene glycol monobutyl ether acetate, diethylene glycol monobutyl ether, toluene, cyclohexane, methyl ethyl ketone, dimethyl carbonate, diethyl carbonate, and propylene carbonate. Diethylene glycol monoethyl ether acetate, α-terpineol, N-methyl-2-pyrrolidone, and propylene carbonate among these organic solvents are preferably used because each of these organic solvents has an appropriately high boiling point, has less evaporation at room temperature, and can be uniformly removed during annealing of the oxide semiconductor precursor to be obtained.

The present embodiment is not particularly limited in terms of the method of producing the precursor including the metal compound, the binder, and the organic solvent. According to an exemplary method, the respective components of the metal compound, the binder, and the organic solvent are stirred in accordance with a conventionally known stirring method so as to be dispersed and dissolved uniformly. According to an adoptable aspect, the precursor can be obtained by stirring an organic solvent including a metal compound and a solution including a binder dissolved in an organic solvent in accordance with a conventionally known stirring method.

Examples of the known stirring method include mixing with use of an agitator, and kneading and mixing by rotation and/or vibration with use of a device such as a mill filled with ceramic balls.

In order for improvement in dispersibility of the metal compound, a dispersant, a plasticizer, or the like can be further added to the solution including the binder where desired.

Specific examples of the dispersant include:
polyhydric alcohol esters such as glycerol and sorbitan;
polyetherpolyols such as diethylene glycol, triethylene glycol, dipropylene glycol, tripropylene glycol, polyethylene glycol, and polypropylene glycol; amine such as polyethyleneimine;
(meth)acrylic resins such as polyacrylic acid and polymethacrylic acid; and
copolymers of isobutylene or styrene and maleic anhydride, and amine salts thereof.

Specific examples of the plasticizer include polyetherpolyols and phthalate esters.

The present embodiment is not particularly limited in terms of the method of forming the oxide semiconductor precursor layer. According to a preferred aspect, the layer is formed in accordance with a low-energy production process. More specifically, it is possible to adopt a printing method such as gravure printing, screen printing, offset printing, or ink jet printing, or a coating method such as roll coating, die coating, air knife coating, blade coating, spin coating, reverse coating, or gravure coating. In particular, the oxide semiconductor precursor layer is formed preferably by applying to the substrate in accordance with a simple method such as the spin coating method or the screen printing method.

As depicted in FIG. 4, a channel precursor layer 42 is formed in accordance with a low-energy production process on the gate insulator 34, in other words, above the substrate 10. The channel precursor layer 42 as an oxide semiconductor precursor layer is not particularly limited in terms of its thickness (wet).

The channel precursor layer 42 is subsequently made to be about 600 nm thick by heating, for example, at 150° C. for a predetermined period (e.g. three minutes) in the preliminary annealing (also referred to as the "first preliminary annealing") step. The first preliminary annealing step is performed mainly for fixation of the channel precursor layer 42 on the gate insulator 34, and can thus be not performed if the second preliminary annealing step to be described later is performed.

The second preliminary annealing step (drying step) at a predetermined temperature (first temperature) is subsequently performed in the present embodiment for decomposition of the binder in the channel precursor layer 42. In the second preliminary annealing step according to the present embodiment, the binder is heated at the first temperature that achieves decomposition of 90 wt % or more of the binder. Through the second preliminary annealing step and main annealing (the annealing step) to be described later, impurities such as carbon impurities originally included particularly in the binder can mostly be eliminated eventually in the channel precursor layer 42. In order to more reliably reduce remaining impurities such as carbon impurities originally included particularly in the binder in the channel 44, the first temperature preferably achieves decomposition of 95 wt % or more of the binder, and more preferably achieves decomposition of 99 wt % or more of the binder.

The second preliminary annealing step is not limited to include drying at normal temperature and normal pressure. For example, the second preliminary annealing step can include treatment such as heating or decompressing like drying by heating, decompression drying, or decompression drying by heating, as long as the substrate, the gate insulator, and the like are not adversely affected. The second preliminary annealing step can possibly influence smoothness of the oxide semiconductor layer. Because behavior during heating differs depending on the solvent, conditions such as the temperature (first temperature) in the second preliminary annealing step are set appropriately in accordance with the type of the solvent.

The second preliminary annealing according to the present embodiment can be exemplified by heating the channel precursor layer 42 at a temperature in the range of from 180° C. or higher to 300° C. or lower for a predetermined period (e.g. 30 minutes). The above preliminary annealing is performed in an oxygen atmosphere or in the atmosphere (hereinafter, also collectively called an "atmosphere containing oxygen"), for example. According to an adoptable aspect, the second preliminary annealing step is performed in a nitrogen atmosphere.

Main annealing is subsequently performed in the "annealing step" by heating the channel precursor layer 42 in an atmosphere containing oxygen or the like for a predetermined period at 200° C. or higher, more preferably at 300° C. or higher, or further preferably in terms of electrical properties at 500° C. or higher. As depicted in FIG. 5, the gate insulator 34 is thus provided thereon with the channel 44 as an oxide semiconductor layer. The oxide semiconductor layer after main annealing is eventually 0.01 µm or more and 10 µm or less in typical thickness. It is noted that the oxide semiconductor layer is unlikely to have cracks even in a case where the film thus formed has extremely small thickness such as about 0.01 µm (i.e. about 10 nm).

The annealing step is performed at a preset temperature not less than the temperature (second temperature) that achieves decomposition of the ligand in the metal compound in the oxide semiconductor forming process and bonding between the metal and oxygen, and has the exothermic peak value in the differential thermal analysis (DTA) to be described later. This annealing step is performed to highly reliably decompose and/or remove the binder, the dispersant, and the organic solvent in the channel precursor layer 42. According to a preferred aspect in terms of more reliable reduction of impurities such as carbon impurities remaining in the oxide semiconductor layer having been mainly annealed, the second temperature is higher than the first temperature by 10° C. or higher. When the second temperature is higher than the first temperature by 50° C. or higher, such remaining impurities can be still more reliably reduced. The second temperature is most preferred to be higher than the first temperature by 100° C. or higher in terms of achievement of controllability and/or reduction of thickness of the final oxide semiconductor layer as well as reduction of the remaining impurities. Meanwhile, the maximum difference between the second temperature and the first temperature is not particularly limited.

According to analysis by the applicants of this application, because the binder is mostly decomposed when heated at the first temperature, reaction occurring in the subsequent annealing step at a temperature equal to or higher than the second temperature (main annealing) includes substantially no decomposition of the binder and relates mostly to bonding between the metal and oxygen. Ideally, cracks will be unlikely to be generated as to be described later even in a very thin layer as described above by differentiating the effects achieved by the first temperature and the second temperature.

None of the first preliminary annealing step, the second preliminary annealing step, and main annealing (the annealing step) described above is particularly limited in terms of its heating method. The heating method can be exemplified by a conventional heating method with use of a thermostat, an electric furnace, or the like. Particularly in a case where the substrate is less heat-resistant, it is preferred to adopt a method of heating only the oxide semiconductor layer by means of ultraviolet rays, electromagnetic waves, or a lamp for prevention of heat transfer to the substrate.

Examples of the binder according to the present embodiment include an acrylic acid resin, an aliphatic polycarbonate, and a polylactic acid. An aliphatic polycarbonate among these binders not only can reduce or eliminate decomposition products remaining in the oxide semiconductor layer after annealing decomposition, but also can contribute to accurate formation of the oxide semiconductor layer and can further improve adhesion between a foundation such as the gate insulator and the oxide semiconductor layer. According to a preferred aspect of the present embodiment, an aliphatic polycarbonate is adopted as the binder.

The aliphatic polycarbonate adopted in the present embodiment is not particularly limited in terms of its type. According to a preferably adoptable aspect of the present embodiment, an aliphatic polycarbonate obtained by polymerization reaction between an epoxide and carbon dioxide is used. Adoption of such an aliphatic polycarbonate obtained by polymerization reaction between an epoxide and carbon dioxide effectively has desired molecular weight achieving improvement in endothermic decomposition properties by control of the structure of the aliphatic polycarbonate. The aliphatic polycarbonate is preferably of at least one type selected from the group consisting of a polyethylene carbonate and a polypropylene carbonate in terms of a high oxygen content and decomposition into a low molecular weight compound at a relatively low temperature.

The epoxide is not particularly limited if the epoxide undergoes a polymerization reaction with carbon dioxide to form an aliphatic polycarbonate having a structure including aliphatic groups on the main chain. Adoptable examples of the epoxide according to the present embodiment include ethylene oxide, propylene oxide, 1-butene oxide, 2-butene oxide, isobutylene oxide, 1-pentene oxide, 2-pentene oxide, 1-hexene oxide, 1-octene oxide, 1-decene oxide, cyclopentene oxide, cyclohexene oxide, styrene oxide, vinylcyclohexene oxide, 3-phenylpropylene oxide, 3,3,3-trifluoropropylene oxide, 3-naphthylpropylene oxide, 3-phenoxypropylene oxide, 3-naphthoxypropylene oxide, butadiene monoxide, 3-vinyloxypropylene oxide, and 3-trimethylsilyloxypropylene oxide. Among these epoxides, ethylene oxide and propylene oxide are preferably used in terms of high polymerization reactivity with carbon dioxide. These epoxides may each be used singly or may be used in combinations of two or more thereof.

The aliphatic polycarbonate mentioned above has a number average molecular weight of preferably from 5000 to 1000000 and more preferably from 10000 to 500000. The aliphatic polycarbonate having a number average molecular weight of less than 5000 exerts insufficient effects as a binder and may cause cracks in the oxide semiconductor layer or deterioration in adhesion between the substrate and the oxide semiconductor layer. The aliphatic polycarbonate having a number average molecular weight of more than 1000000 may be hard to be dealt due to lower dissolubility of the aliphatic polycarbonate into an organic solvent. The numerical values of the number average molecular weight are measured in accordance with a method to be mentioned in examples to be described later.

The aliphatic polycarbonate mentioned above can be exemplarily produced by polymerization reaction between the epoxide and carbon dioxide in the presence of a metal catalyst.

Specific examples of the metal catalyst include an aluminum catalyst and a zinc catalyst. Among these metal catalysts, the zinc catalyst is preferably used in terms of high polymerization activity in polymerization reaction between epoxide and carbon dioxide. An organozinc catalyst is particularly preferred among the zinc catalysts.

Specific examples of the organozinc catalyst include:
organozinc catalysts such as zinc acetate, diethyl zinc, and dibutyl zinc; and
organozinc catalysts obtained by reaction between a zinc compound and compounds such as primary amine, dihydric phenol, divalent aromatic carboxylic acid, aromatic hydroxy acid, aliphatic dicarboxylic acid, and aliphatic monocarboxylic acid.

According to a preferred aspect, an organozinc catalyst among these organozinc catalysts is adopted, which is obtained by reaction of a zinc compound with an aliphatic dicarboxylic acid and an aliphatic monocarboxylic acid, due to higher polymerization activity.

The amount of the metal catalyst used for the polymerization reaction is preferably 0.001 to 20 parts by mass and more preferably 0.01 to 10 parts by mass with respect to 100 parts by mass of the epoxide. The polymerization reaction may be unlikely to progress if the amount of the used metal catalyst is less than 0.001 parts by mass. In contrast, if the amount of the used metal catalyst exceeds 20 parts by mass, effects in accord with the amount of use may not be obtained, which may be economically undesirable.

A reaction solvent to be used as necessary in the polymerization reaction is not particularly limited. Any type of an organic solvent can be adopted as the reaction solvent. Specific examples of the organic solvent include:
aliphatic hydrocarbon solvents such as pentane, hexane, octane, decane, and cyclohexane;
aromatic hydrocarbon solvents such as benzene, toluene, and xylene;
halogenated hydrocarbon solvents such as chloromethane, methylene dichloride, chloroform, carbon tetrachloride, 1,1-dichloroethane, 1,2-dichloroethane, ethyl chloride, trichloroethane, 1-chloropropane, 2-chloropropane, 1-chlorobutane, 2-chlorobutane, 1-chloro-2-methylpropane, chlorobenzene, and bromobenzene; and
carbonate solvents such as dimethyl carbonate, diethyl carbonate, and propylene carbonate.

The amount of the used reaction solvent is preferably 500 parts by mass or more and 10000 parts by mass or less with respect to 100 parts by mass of the epoxide in terms of smooth reaction.

The method of the reaction between an epoxide and carbon dioxide in the presence of a metal catalyst is not particularly limited in the polymerization reaction described above. For example, an adoptable method includes charging in an autoclave the epoxide, the metal catalyst, and a reaction solvent as necessary, mixing these components, and then injecting carbon dioxide under pressure for reaction.

The pressure under which the carbon dioxide is used in the polymerization step is not particularly limited. Typically, the pressure is preferably from 0.1 MPa to 20 MPa, more preferably from 0.1 MPa to 10 MPa, and even more preferably from 0.1 MPa to 5 MPa. If the carbon dioxide is used at a pressure exceeding 20 MPa, effects in accord with the amount of use may not be obtained, which may be economically undesirable.

The polymerization reaction temperature in the above polymerization reaction is not particularly limited. The typical polymerization reaction temperature is preferably from 30 to 100° C. and more preferably from 40 to 80° C. If the polymerization reaction temperature is lower than 30° C., the polymerization reaction may take a long period. In contrast, if the polymerization reaction temperature exceeds 100° C., side reaction may occur with a lower yield. The period of the polymerization reaction is typically preferred to be from 2 to 40 hours, although the period differs depending on the polymerization reaction temperature and cannot be determined generally.

After the completion of the polymerization reaction, the aliphatic polycarbonate may be obtained by filtration or the like, and washing with a solvent or the like as necessary, followed by drying.

The inventors of this application have also found, through research, that the final channel 44 can be controlled in thickness in the present embodiment by variation in weight ratio of the binder and the compound of metal to be oxidized into an oxide semiconductor. For example, it was found that the channel 44 of 10 nm to 50 nm in thickness, which is regarded as a very thin layer, can be formed with no cracks. The channel of the thin layer as well as the channel of a layer of 50 nm or more in thickness can be formed relatively easily by appropriately adjusting the thickness of the channel precursor layer 42, the weight ratio, or the like. The layer of a channel is generally 0.01 μm (i.e. 10 nm) or more and 1 μm or less in thickness. The oxide semiconductor precursor and the oxide semiconductor layer according to the present embodiment, which enable control of the final channel 44 in terms of thickness, are thus regarded as suitable materials for a thin film transistor.

Furthermore, when adopting the oxide semiconductor precursor according to the present embodiment, the oxide semiconductor precursor layer, which may be considerably thick (e.g. 10 μm or more) at an initial stage, can be made extremely thin (e.g. 10 nm to 100 nm) after annealing because the binder and the like are decomposed highly reliably in the subsequent annealing step. It is noted that even such a thin layer has no cracks or highly reliably reduced cracks. It was found that the oxide semiconductor precursor and the oxide semiconductor layer according to the present embodiment, which can initially have sufficient thickness and can eventually be thinned extremely, are very suitable in a low-energy production process or an imprinting process to be described later. Adoption of the oxide semiconductor layer, which is extremely thin but has no cracks or highly reliably reduced cracks, will extremely improve stability of the thin film transistor 100 according to the present embodiment.

The oxide semiconductor layer configuring the channel can be improved in electrical properties and stability in the present embodiment by appropriately adjusting the type of the metal compound, combinations, and a ratio for mixing with the binder.

(4) Formation of Source Electrode and Drain Electrode

As depicted in FIG. 6, after the channel 44 is subsequently provided thereon with a resist film 90 that is patterned in accordance with a known photolithography technique, the channel 44 and the resist film 90 are provided thereon with an ITO layer 50 in accordance with a known sputtering technique. An exemplary target material according to the present embodiment is ITO containing 5 wt % of tin dioxide ($SnO_2$) and is formed under a condition of from room temperature to 100° C. When the resist film 90 is subsequently removed, the channel 44 is provided thereon with the drain electrode 56 and the source electrode 58 configured by the ITO layer 50, as depicted in FIG. 7.

After the resist film 90 patterned in accordance with a known photolithography technique is subsequently formed on the drain electrode 56, the source electrode 58, and the channel 44, the exposed channel 44 is removed in accordance with a known dry etching technique using argon (Ar) plasma with the resist film 90, part of the drain electrode 56, and part of the source electrode 58 serving as masks. The patterned channel 44 is thus provided and the thin film transistor 100 is completed.

Modification Example of First Embodiment

A thin film transistor according to the present embodiment is similar to the thin film transistor 100 according to the first embodiment in terms of the production steps and the configurations, except that the ultraviolet irradiation step is additionally performed after the step of annealing the channel in the first embodiment (main annealing). Accordingly, the configurations similar to those of the first embodiment will not be described repeatedly.

In the present embodiment, ultraviolet rays having wavelengths of 185 nm and 254 nm were applied using a known low pressure mercury lamp (manufactured by SAMCO Inc., model: UV-1) after the channel annealing step (main annealing) in the first embodiment. The steps similar to those in the method of producing the thin film transistor 100 according to the first embodiment were performed subsequently. The wavelengths of ultraviolet rays are not particularly limited in the present embodiment. Similar effects can be exerted with ultraviolet rays having wavelengths other than 185 nm and 254 nm.

EXAMPLES

Described below are specific examples of a semiconductor element (a thin film transistor in the present examples) including an oxide semiconductor layer as well as production examples, examples, and a comparative example of an oxide semiconductor precursor and an oxide semiconductor layer. It is noted that the forgoing embodiments are not limited to these examples.

[Production Example 1] (Production of Organozinc Catalyst)

A four-necked flask having a volume of 300 mL and equipped with a stirrer, a nitrogen gas introduction tube, a thermometer, and a reflux condenser was charged with 8.1 g (100 mmol) of zinc oxide, 12.7 g (96 mmol) of glutaric acid, 0.1 g (2 mmol) of acetic acid, and 130 g (150 mL) of toluene. After the atmosphere of the reaction system was replaced with a nitrogen, the temperature of the flask was raised to 55° C. and the materials were stirred at this temperature for four hours so as to cause reaction of the respective materials. The temperature of the flask was then raised to 110° C. and the materials were stirred at this temperature for four hours so as to cause azeotropic dehydration for removal of only water. The flask was then cooled to room temperature so as to obtain a reaction solution including an organozinc catalyst.

The organozinc catalyst, which was obtained by partially fractionating and filtrating the reaction solution, was subjected to IR measurement (apparatus manufactured by Thermo Nicolet Japan Inc., trade name: AVATAR360). There was found no peak based on carboxylic groups.

[Production Example 2] (Production of Polypropylene Carbonate)

The atmosphere of the system of an autoclave having a volume of 1 L and equipped with a stirrer, a gas introduction tube, and a thermometer was preliminarily replaced with a nitrogen, and was then charged with 8.0 mL of a reaction solution including an organozinc catalyst obtained in accordance with a method similar to that of Production Example 1 (including 1.0 g of the organozinc catalyst), 131 g (200 mL) of hexane, and 46.5 g (0.80 mol) of propylene oxide. The atmosphere of the reaction system was then replaced with a carbon dioxide by adding carbon dioxide with stirring, and the autoclave was filled with carbon dioxide until the pressure of the reaction system reached 1.5 MPa. The temperature of the autoclave was subsequently raised to 60° C. and polymerization reaction was carried out for six hours while supplying carbon dioxide to be consumed by the reaction.

The autoclave was cooled, and depressurized and its content was filtrated after the reaction was completed. The filtrated product was then dried under reduced pressure to obtain 80.8 g of a polypropylene carbonate (also referred to as "PPC" in this application).

The polypropylene carbonate thus obtained had the following physical properties and could thus be identified from the physical properties.

absorption peaks of IR (KBr): 1742, 1456, 1381, 1229, 1069, and 787 (each by the unit of $cm^{-1}$)

The obtained polypropylene carbonate had a number average molecular weight of 52000.

[Production Example 3] (Production of Oxide Semiconductor Precursor)

An eggplant-shaped flask having a volume of 50 mL was charged with 2.06 g of indium acetylacetonate and 7.94 g of propionic acid to obtain 10 g of a first solution (0.5 mol/kg). An eggplant-shaped flask having a volume of 50 mL was charged with 0.68 g of zinc chloride and 2-methoxyethanol to obtain 10 g of a second solution (0.5 mol/kg) in the similar manner as above. The first solution and the second solution were gradually mixed together while being stirred to obtain an indium-zinc containing solution that eventually serves as an indium-zinc oxide.

In an eggplant-shaped flask having a volume of 50 mL, the polypropylene carbonate obtained in Production Example 2 was dissolved in diethylene glycol monoethyl ether acetate to obtain 10 g of a polypropylene carbonate solution (6.25 wt %).

The indium-zinc containing solution was then gradually added to the polypropylene carbonate solution to obtain an oxide semiconductor precursor having a weight ratio of 10:2.

[Modification Example of Production Example 3] (Production of Oxide Semiconductor Precursor)

A precursor produced in accordance with the modification example had a different weight ratio of a polypropylene carbonate (PPC) and an indium-zinc containing solution (also referred to as an "InZn solution" in this application) in an oxide semiconductor precursor layer (the channel precursor layer 42 according to the first embodiment).

Specifically, the precursors having the following three types of weight ratios (a) to (c) were produced including the precursor according to Production Example 3.
(a) PPC:InZnO=10:1.5
(b) PPC:InZnO=10:2
(c) PPC:InZnO=10:1

Comparative Example (1) Regarding Production Example 3

An oxide semiconductor precursor to be compared was obtained in the similar manner as in Production Example 3 except that a polypropylene carbonate was not used.

Production Example of Thin Film Transistor

In the present production example, the substrate 10 was initially provided thereon with a p$^+$-silicon layer as the gate electrode 20. The p$^+$-silicon layer was formed in accordance with a known CVD technique. The substrate 10 according to the present production example is a SiO$_2$/Si substrate, and is provided, on SiO$_2$, with a TiO$_x$ film of about 10 nm thick (not depicted). In a case where the substrate 10 is a p$^+$-silicon substrate, the substrate 10 can serve as a gate electrode.

The gate electrode 20 is subsequently provided thereon with the gate insulator precursor layer 32 from, as a starting material, a gate insulator precursor solution containing polysilazane as a solute in accordance with a known spin coating method. Similarly to the first embodiment, the gate insulator precursor layer 32 is heated in the atmosphere to provide the gate insulator 34 as a silicon oxide layer on the gate electrode 20. The gate insulator 34 was about 109 nm thick.

The gate insulator 34 is subsequently provided thereon with three types of oxide semiconductor precursor layers (a) to (c) exemplified in Production Example 3 and the modification example thereof in accordance with a printing method (specifically, a screen printing method, a relief reversal printing method, an imprinting method, or the like). The first preliminary annealing step, the second preliminary annealing step, and the annealing step (main annealing) are similar to those according to the first embodiment. The channel 44 is about 20 nm thick.

Apart from the channel formation, the three types of the oxide semiconductor precursor layers (a) to (c) according to Production Example 3 and the modification example thereof were irradiated with ultraviolet rays for 30 minutes using the low pressure mercury lamp mentioned in the modification example of the first embodiment after the annealing step (main annealing) to obtain precursor layers (three types of precursor layers (a) to (c)) according to Production Example 4.

[Evaluation of Oxide Semiconductor Precursors and Oxide Semiconductor Layers According to Respective Production Examples]

The number average molecular weight of the aliphatic polycarbonate obtained in each of the above production examples, as well as the thickness and properties of the binder and the oxide semiconductor precursor layer obtained in each of the production examples and the comparative example were measured in accordance with the following method for evaluation.

(1) Number Average Molecular Weight of Aliphatic Polycarbonate

A chloroform solution containing the aliphatic polycarbonate (the polypropylene carbonate according to Production Example 2) having a concentration of 0.5% by mass was prepared and measured using high performance liquid chromatography. After the measurement, the molecular weight was calculated by comparison with polystyrene having known number average molecular weight measured under the identical conditions. The measurement was performed under the following conditions.

Type: HLC-8020

Column: GPC column (Trade name of Tosoh Corporation: TSK GEL Multipore HXL-M)

Column temperature: 40° C.

Eluate: chloroform

Flow speed 1 mL/minute (2) Evaluation of Oxide Semiconductor Layer

The surface of an exemplary silicon substrate provided with a thermal oxide film (20 mm wide, 20 mm long, and 0.7 mm thick), which is to serve as a base material, was washed with acetone. The silicon substrate provided with the thermal oxide film was then surface treated using an UV treatment apparatus (manufactured by SAMCO Inc.) to obtain a test substrate.

This test substrate was provided thereon with a layer of an oxide semiconductor precursor in accordance with the spin coating method under the conditions of a rotational speed of 1500 rpm and a period of 20 seconds. The layer was then dried at 150° C. for three minutes to remove the solvent. The obtained layer of the oxide semiconductor precursor was 600 nm thick.

The oxide semiconductor precursor layer thus obtained was heated at 180° C. in the atmosphere and was then kept at this temperature for 30 minutes. This treatment corresponds to the second preliminary annealing step according to the first embodiment.

In the subsequent annealing step (main annealing), the oxide semiconductor precursor layer was heated so as to raise its temperature to 500° C. in 0.3 minutes and was then kept at this temperature for 10 minutes. The oxide semiconductor precursor layer was then air-cooled down to 25° C. to obtain an oxide semiconductor layer.

(2-1) Evaluation of Thickness of Oxide Semiconductor Layer

Variation in thickness of the oxide semiconductor layers obtained by applying the treatment described above to the three types of precursor layers (a) to (c) was measured in accordance with an ellipsometry method. FIG. 10 is a graph indicating variation in thickness of the oxide semiconductor layer.

(2-2) Evaluation of Surface Shape of Oxide Semiconductor Layer

The surfaces of the oxide semiconductor layers were observed using an optical microscope to check the presence or absence of cracks. An oxide semiconductor layer having no visually recognized cracks was evaluated as "circle (good)" whereas an oxide semiconductor layer having significantly recognized cracks was evaluated as "NG". Table 1 below as well as FIGS. 11 and 12 indicate evaluation results thereof. FIG. 11 is an optical photomicrograph of the surface of the oxide semiconductor layer according to Production Example (3) above. FIG. 12 is an optical photomicrograph of the surface of the oxide semiconductor layer according to Comparative Example (1).

TABLE 1

| Measurement target | Measurement point Presence or absence of cracks |
| --- | --- |
| Production Example 3 | ◯ |
| Production Example 4 | ◯ |
| Comparative Example 1 | NG |

(2) TG-DTA (Thermogravimetry and Differential Heat) Properties

FIG. 13 is a graph indicating TG-DTA properties of the indium-zinc containing solution (the InZn solution according to Production Example 3) as the oxide semiconductor precursor configuring the channel of the thin film transistor according to the present example. FIG. 14 is a graph indicating TG-DTA properties of the binder solution (the polypropylene carbonate solution according to Production Example 3) configuring a channel portion of the thin film transistor according to the present example (Production Example 3). As indicated in FIGS. 13 and 14, solid lines in these figures indicate thermogravimetry (TG) results whereas dotted lines indicate differential heat (DTA) measurement results.

As observed in the thermogravimetry result indicated in FIG. 13, there is significant reduction in weight at around 120° C., which is assumed to be due to evaporation of the solvent. As indicated at a point (X) in FIG. 13, an exothermic peak in the graph of the measured differential heat of the InZn solution was found at around 330° C. It is thus found that indium and zinc are in the state of being bonded with oxygen at around 330° C. This temperature of 330° C. thus corresponds to the second temperature according to the first embodiment.

As observed in the thermogravimetry result indicated in FIG. 14, there is significant reduction in weight in the range of from around 140° C. to around 190° C., due to elimination of the solvent of the polypropylene carbonate solution according to Production Example 3 and partial decomposition or elimination of the polypropylene carbonate itself as a binder. The polypropylene carbonate is assumed to be decomposed into carbon dioxide and water by this decomposition. As observed in the result indicated in FIG. 14, 90 wt % or more of the binder is decomposed and removed at around 190° C. This temperature of 190° C. thus corresponds to the first temperature according to the first embodiment. More specifically, it is found that 95 wt % or more of the binder is decomposed at around 250° C. and almost all (99 wt % or more) of the binder is decomposed at around 260° C.

As described above, in the relation between the InZn solution according to Production Example 3 and the polypropylene carbonate as the binder according to Production Example 2, assuming that 90 wt % or more of the binder is decomposed at the first temperature, FIGS. 13 and 14 indicate that the difference between the first temperature and the second temperature is about 140° C. It is thus possible to highly reliably reduce impurities such as carbon impurities remaining in the oxide semiconductor layer by performing the annealing step (main annealing) at a temperature equal to or higher than the second temperature. In other words, it is possible to highly reliably reduce impurities such as carbon impurities remaining in the oxide semiconductor layer with a sufficient difference between the first temperature and the second temperature (e.g. 100° C. or higher). As indicated in Table 1, the layer has no visually recognized cracks and can exert excellent electrical properties as a thin film transistor as to be described later. According to further research and analysis, regarding the various binders already described (aliphatic polycarbonate) and the various metal containing pastes serving eventually as oxide semiconductors such as the InZn solution, if the difference between the first temperature and the second temperature is 10° C. or higher, more preferably 50° C. or higher, or further preferably 100° C. or higher, impurities such as carbon impurities remaining in the oxide semiconductor layer can be reduced.

[Evaluation of Electrical Properties of Thin Film Transistors According to Production Examples]

There were checked the properties of the thin film transistors including, as channels, the oxide semiconductor precursor layers obtained in accordance with the respective production examples.

(1) Current-Voltage Properties of Thin Film Transistor Corresponding to First Embodiment FIG. 16 is a graph indicating Vg-Id properties of the channel of the thin film transistor according to the example corresponding to the first embodiment ((b) in Production Example 3 and the modification example of Production Example 3). The properties as well as Vg-Id properties indicated in FIG. 17 to be mentioned later were measured using a simple Vg-Id properties measurement system depicted in FIG. 15. Reference sign Vg in FIG. 15 denotes a terminal configured to apply voltage corresponding to gate voltage. Reference signs Vd and Vs denote terminals configured to detect current values as electrodes respectively corresponding to a drain electrode and a source electrode.

As apparent from FIG. 16, there were properties indicating that the channel of the thin film transistor including the oxide semiconductor layer according to the present example (Production Example 3) serves as a semiconductor. It was thus found that the thin film transistor including the oxide semiconductor layer according to the present example (Production Example 3) also exerts excellent electrical properties as a transistor. The layers of mixing ratios other than the mixing ratio (b) according to Production Example 3 and the modification example of Production Example 3, namely, the layers of the mixing ratios (a) and (c) had no switching properties as a thin film transistor found at this stage.

(2) Current-Voltage Properties of Thin Film Transistor Corresponding to Modification Example of First Embodiment FIG. 17 is a graph indicating Vg-Id properties corresponding to those in FIG. 16, according to the three examples corresponding to the modification example of the first embodiment ((a) to (c) in Production Example 4).

As apparent from FIG. 17, there were properties indicating that the channel of the thin film transistor including each of the three oxide semiconductor layers according to the present example (Production Example 4) serves as a semiconductor. It was thus found that, by performing the ultraviolet irradiation step after the annealing step (main annealing), excellent electrical properties are exerted regardless of the weight ratio of the polypropylene carbonate (PPC) and the InZn solution at least in the range indicated in Production Example 3. It is assumed that, irradiation of the oxide semiconductor layer having been annealed with ultraviolet rays further promotes decomposition or evaporation of impurities such as carbon impurities, which are considered to be very small in amount, in the oxide semiconductor layer so as to further reduce the residual amount thereof or eliminate the impurities.

It was found that the channels according to the present example have excellent electrical properties as described above. The thin film transistor including each of the channels according to the present example is thus assumed as having excellent electrical properties.

Second Embodiment

1. Method of Producing Thin Film Transistor 200

FIGS. 18 to 21 are schematic sectional views of processes in the method of producing the thin film transistor 200. FIG. 22 is a schematic sectional view of a process in the method of producing the thin film transistor 200 according to the present embodiment and an entire structure of the thin film transistor. Patterning of an extraction electrode from each electrode is not depicted in order for simplification of the drawings. Furthermore, the configurations similar to those of the first embodiment will not be described repeatedly.

(1) Formation of Gate Electrode

As depicted in FIG. 18, the substrate 10 is initially provided thereon with the gate electrode 20 in accordance with a sputtering technique, a photolithography technique, or an etching technique, which are known to the public. The gate electrode 20 according to the present embodiment is made of platinum (Pt).

(2) Formation of Gate Insulator

Similarly to the first embodiment, the substrate 10 and the gate electrode 20 are subsequently provided thereon with a gate insulator precursor layer from, as a starting material, a gate insulator precursor solution containing polysilazane as a solute in accordance with a low-energy production process. The gate insulator precursor layer is then preliminary annealed by being heated to a temperature in the range between 80° C. or higher and lower than 250° C. in the atmosphere (including moisture).

The gate insulator precursor layer according to the present embodiment is then subjected to the annealing step of heating at 400° C. for a predetermined period (e.g. two hours) in the atmosphere, for example. As depicted in FIG. 19, the gate electrode 20 is thus provided thereon with the gate insulator 34 as a silicon oxide layer.

(3) Formation of Channel

Imprinting is applied to the channel precursor layer 42 that has been subjected to the second preliminary annealing step according to the first embodiment. The gate insulator 34 and the substrate 10 are initially provided thereon with the channel precursor layer 42 as in the first embodiment. The first preliminary annealing step and the second preliminary annealing step are then performed similarly to the first embodiment.

As depicted in FIG. 20, the channel precursor layer 42 is then imprinted using a channel mold M1 with a pressure of 0.1 MPa or more and 20 MPa or less (typically 1 MPa) while the channel precursor layer 42 is heated at a temperature in the range of from 80° C. or higher to 300° C. or lower.

The channel precursor layer 42 according to the present embodiment is then entirely etched by plasma irradiation in the atmospheric pressure. Specifically, the channel precursor layer 42 is etched by plasma formed under the condition of application with 500 W power in a state where 50 mL/minute of oxygen ($O_2$), 0.1 L/minute of argon (Ar), and 9 L/minute of helium (He) are introduced into an etching chamber. The channel precursor layer 42 is removed in a region provided with no pattern (removal target region) whereas the channel precursor layer 42 in a region to be provided with a pattern has thickness of at least a constant value so as to be patterned eventually. The annealing step (main annealing) is then performed for a predetermined period at a temperature in the range of from 330° C. or higher to 550° C. or lower, to obtain the channel 44 as depicted in FIG. 21.

According to a preferred aspect in terms of more reliably and easily removing a residual (unnecessary) portion of the channel precursor layer 42 having been imprinted, the plasma etching in the atmospheric pressure is performed after the second preliminary annealing step. This etching step more reliably achieves eventual thinning of the channel 44 (e.g. about 10 nm to 30 nm). According to an adoptable aspect, the step of entirely etching the channel precursor layer 42 is also performed as described above after the annealing step (main annealing).

(4) Formation of Source Electrode and Drain Electrode

Similarly to the first embodiment, after the resist film patterned in accordance with a known photolithography technique is subsequently formed on the channel 44, the channel 44 and the resist film are provided thereon with an ITO layer in accordance with a known sputtering technique. When the resist film is subsequently removed, the channel 44 is provided thereon with the drain electrode 56 and the source electrode 58 configured by the ITO layer, as depicted in FIG. 22.

The precursor layer having high plastic deformability is imprinted in the present embodiment. Accordingly, even if the imprinting is performed with such a low pressure in the range of from 0.1 MPa or more to 20 MPa or less, each precursor layer is deformed so as to follow the shape of the surface of the mold. It is thus possible to highly accurately form a desired imprinted structure. The pressure is set in such a low range of from 1 MPa or more to 20 MPa or less, so that the mold is less likely to be damaged during the imprinting and increase in area can be also achieved advantageously.

The pressure is set within the range of "from 0.1 MPa or more to 20 MPa or less" for the following reasons. If the pressure is less than 0.1 MPa, each precursor layer may not be imprinted with such a low pressure. In a case where a polypropylene carbonate is adopted as a binder, the polypropylene carbonate, which is a relatively soft material, can be imprinted even with a pressure of about 0.1 MPa. If the pressure is as large as 20 MPa, the precursor layer can be imprinted sufficiently and no more pressure needs to be applied thereto. In view of the above, the imprinting is more preferably performed with a pressure in the range of from 0.5 MPa or more to 10 MPa or less in the imprinting step according to the second embodiment.

As described above, the present embodiment includes the "imprinting step" of imprinting the channel 44 to provide an imprinted structure. By including this imprinting step, there is no need to include a process requiring a relatively long period and/or expensive equipment, such as the vacuum process, a process in accordance with a photolithography technique, or the ultraviolet irradiation process.

Other Embodiments

In the imprinting step according to the second embodiment, preferably, mold releasing treatment is preliminarily applied to the surface of each precursor layer to be in contact with an imprinting surface and/or to the imprinting surface of the mold, and each precursor layer is then imprinted. Such treatment can decrease frictional force between each precursor layer and the mold. Each precursor layer can thus be imprinted with higher accuracy. Examples of an applicable mold releasing agent in the mold releasing treatment include surfactants (e.g. a fluorine surfactant, a silicone surfactant, and a non-ionic surfactant), and diamond-like carbon containing fluorine.

The above embodiments each relate to a thin film transistor having the so-called inversely-staggered structure. However, these embodiments are not limited to this structure. For example, effects similar to those of the respective embodiments can be exerted not only by the thin film transistor having the inversely-staggered structure, but also by a thin film transistor having the so-called planar structure including a source electrode, a drain electrode, and a channel disposed on an identical plane. According to a different adoptable aspect, the substrate is provided thereon with the channel (i.e. the oxide semiconductor layer) according to each of the above embodiments.

FIG. 13 according to one of the examples has only one peak indicated by the point (X) of the second temperature. However, the number of the exothermic peak is not limited to one in a graph of measured differential heat. The graph of measured differential heat can have two or more exothermic peaks with a different solute included in the solution configuring the oxide semiconductor precursor, or the material for the precursor, according to each of the above embodiments. The second temperature needs to be at least higher than the first temperature in this case. The second temperature is thus preferably set to a lower temperature having one of the plurality of exothermic peaks.

As described above, the above embodiments have been disclosed not for limiting the present invention but for describing these embodiments. Furthermore, modification examples made within the scope of the present invention, inclusive of other combinations of the embodiments, will also be included in the scope of the patent claims.

INDUSTRIAL APPLICABILITY

The present invention provides an oxide semiconductor layer that has less cracks and is excellent in electrical property and stability, as well as a semiconductor element and an electronic device each including the oxide semiconductor layer. The present invention is thus applicable in a wide industrial field.

The invention claimed is:

1. A method of producing an oxide semiconductor layer, the method comprising:
   a precursor layer forming step of forming, on or above a substrate, a layered oxide semiconductor precursor including a compound of metal to be oxidized into an oxide semiconductor dispersed in a solution including a binder made of an aliphatic polycarbonate (possibly including inevitable impurities); and
   an annealing step of heating the precursor layer at a first temperature achieving decomposition of 90 wt % or more of the binder, and then annealing the precursor layer at a temperature equal to or higher than a second temperature that is higher than the first temperature, achieves bonding between the metal and oxygen, and has an exothermic peak value in differential thermal analysis (DTA) for the compound.

2. The method of producing the oxide semiconductor layer according to claim 1, wherein
   the second temperature is higher than the first temperature by at least 10° C.

3. The method of producing the oxide semiconductor layer according to claim 1, wherein
   the second temperature is higher than the first temperature by at least 50° C.

4. The method of producing the oxide semiconductor layer according to claim 1, the method further comprising:
   an irradiation step of irradiating with ultraviolet rays after the annealing step.

5. The method of producing the oxide semiconductor layer according claim 1, wherein
   the aliphatic polycarbonate is an aliphatic polycarbonate obtained by polymerizing an epoxide and carbon dioxide.

6. The method of producing the oxide semiconductor layer according to claim 1, wherein
   the aliphatic polycarbonate is at least one selected from the group consisting of a polyethylene carbonate and a polypropylene carbonate.

7. An oxide semiconductor precursor comprising a compound of metal to be oxidized into an oxide semiconductor dispersed in a solution including a binder made of an aliphatic polycarbonate (possibly including inevitable impurities), wherein
   90 wt % or more of the binder is decomposed at a first temperature lower than a second temperature that achieves bonding between the metal and oxygen and has an exothermic peak value in differential thermal analysis (DTA) for the compound.

8. The oxide semiconductor precursor according to claim 7, wherein the second temperature is higher than the first temperature by at least 10° C.

9. The oxide semiconductor precursor according to claim 7, wherein the second temperature is higher than the first temperature by at least 50° C.

10. The oxide semiconductor precursor according to claim 7, wherein
    the aliphatic polycarbonate is an aliphatic polycarbonate obtained by polymerizing an epoxide and carbon dioxide.

11. The oxide semiconductor precursor according to claim 7, wherein the aliphatic polycarbonate is at least one selected from the group consisting of a polyethylene carbonate and a polypropylene carbonate.

12. An oxide semiconductor layer formed by annealing a layer of an oxide semiconductor precursor including a compound of metal to be oxidized into an oxide semiconductor dispersed in a solution including a binder made of an aliphatic polycarbonate (possibly including inevitable impurities) at a temperature equal to or higher than a second temperature that achieves bonding between the metal and oxygen and has an exothermic peak value in differential thermal analysis (DTA) for the compound, wherein 90 wt % or more of the binder is decomposed at a first temperature lower than the second temperature.

13. The oxide semiconductor layer according to claim 12, wherein the second temperature is higher than the first temperature by at least 10° C.

14. The oxide semiconductor layer according to claim 12, wherein the second temperature is higher than the first temperature by at least 50° C.

15. A semiconductor element comprising:
    the oxide semiconductor layer according to claim 12.

16. An electronic device comprising:
    the semiconductor element according to claim 15.

* * * * *